(12) United States Patent
Rosen et al.

(10) Patent No.: US 10,830,848 B2
(45) Date of Patent: Nov. 10, 2020

(54) SYSTEM AND METHOD FOR LOW-FIELD, MULTI-CHANNEL IMAGING

(71) Applicant: THE GENERAL HOSPITAL CORPORATION, Boston, MA (US)

(72) Inventors: Matthew S. Rosen, Somerville, MA (US); Lawrence L. Wald, Charlestown, MA (US); Cristen LaPierre, Woburn, MA (US)

(73) Assignee: The General Hospital Corporation, Boston, MA (US)

( * ) Notice: Subject to any disclaimer, the term of this patent is extended or adjusted under 35 U.S.C. 154(b) by 489 days.

(21) Appl. No.: 15/125,514

(22) PCT Filed: Mar. 13, 2015

(86) PCT No.: PCT/US2015/020509
§ 371 (c)(1),
(2) Date: Sep. 12, 2016

(87) PCT Pub. No.: WO2015/138939
PCT Pub. Date: Sep. 17, 2015

(65) Prior Publication Data
US 2017/0074956 A1 Mar. 16, 2017

Related U.S. Application Data

(60) Provisional application No. 61/953,384, filed on Mar. 14, 2014.

(51) Int. Cl.
*G01R 33/00* (2006.01)
*G01R 33/10* (2006.01)
(Continued)

(52) U.S. Cl.
CPC ..... *G01R 33/3657* (2013.01); *G01R 33/3415* (2013.01); *G01R 33/34046* (2013.01);
(Continued)

(58) Field of Classification Search
CPC ........ G01R 33/00; G01R 33/10; G01R 33/20; G01R 33/34; G01R 33/36; G01R 33/44;
(Continued)

(56) References Cited

U.S. PATENT DOCUMENTS 4,636,730 A 1/1987 Bottomley
5,050,605 A 9/1991 Eydelman et al.
(Continued)

FOREIGN PATENT DOCUMENTS

CN 101073017 11/2007
JP S638544 A 1/1988
(Continued)

OTHER PUBLICATIONS

Constantinides, et al., A Novel Spiral Radiofrequency Coil for High Field Mouse Cardiac Imaging, In Engineering in Medicine and Biology Society (EMBC), 2010 Annual International Conference of the IEEE, 2010, pp. 6657-6661.
(Continued)

*Primary Examiner* — Neel D Shah
(74) *Attorney, Agent, or Firm* — Quarles & Brady LLP

(57) ABSTRACT

A system and method for performing parallel magnetic resonance imaging (pMRI) process using a low-field magnetic resonance imaging (lfMRI) system includes a substrate configured to follow a contour of a portion of a subject to be imaged by the lfMRI system using a pMRI process. A plurality of coils are coupled to the substrate. Each coil in the plurality of coils has a number of turns and an associated decoupling mechanism selected to operate the plurality of coils to effectuate the pMRI process using the lfMRI system.

24 Claims, 9 Drawing Sheets

(51) Int. Cl.
| | |
|---|---|
| *G01R 33/20* | (2006.01) |
| *G01V 3/00* | (2006.01) |
| *A61B 5/05* | (2006.01) |
| *G01R 33/36* | (2006.01) |
| *G01R 33/44* | (2006.01) |
| *G01R 33/561* | (2006.01) |
| *G01R 33/3415* | (2006.01) |
| *G01R 33/34* | (2006.01) |
| *G01R 33/563* | (2006.01) |
| *G01R 33/567* | (2006.01) |

(52) U.S. Cl.
CPC ........ *G01R 33/445* (2013.01); *G01R 33/5611* (2013.01); *G01R 33/34007* (2013.01); *G01R 33/365* (2013.01); *G01R 33/5635* (2013.01); *G01R 33/5673* (2013.01)

(58) Field of Classification Search
CPC ........ G01R 33/48; G01R 33/561; A61B 5/05; G01V 3/00
See application file for complete search history.

(56) References Cited

U.S. PATENT DOCUMENTS

| | | | | |
|---|---|---|---|---|
| 7,619,413 | B2* | 11/2009 | Wiggins | A61B 5/055 324/309 |
| 8,473,029 | B2* | 6/2013 | Gerhart | A61B 5/042 600/411 |
| 9,585,594 | B2* | 3/2017 | Martens | G01R 33/34007 |
| 2001/0037063 | A1* | 11/2001 | Albert | G01R 33/445 600/420 |
| 2003/0114748 | A1 | 6/2003 | Su et al. | |
| 2004/0027125 | A1* | 2/2004 | Clarke | G01R 33/0356 324/308 |
| 2005/0253582 | A1 | 11/2005 | Giaquinto et al. | |
| 2006/0052685 | A1* | 3/2006 | Cho | G01R 33/20 600/407 |
| 2006/0091881 | A1* | 5/2006 | Clarke | G01R 33/326 324/301 |
| 2006/0244448 | A1 | 11/2006 | Ballon | |
| 2008/0007250 | A1* | 1/2008 | Wiggins | A61B 5/055 324/200 |
| 2009/0230965 | A1* | 9/2009 | DeVries | G01R 33/3403 324/322 |
| 2010/0033183 | A1 | 2/2010 | Ochi | |
| 2011/0095758 | A1* | 4/2011 | Walsh | A61B 5/055 324/307 |
| 2012/0065491 | A1* | 3/2012 | Borgert | A61B 5/05 600/409 |
| 2013/0241548 | A1* | 9/2013 | Gleich | A61B 5/0515 324/307 |
| 2013/0271144 | A1* | 10/2013 | Avdievich | G01R 33/3642 324/322 |
| 2014/0159727 | A1* | 6/2014 | Lee | G01R 33/341 324/322 |
| 2014/0266206 | A1* | 9/2014 | Dempsey | G01R 33/34092 324/322 |
| 2014/0300360 | A1* | 10/2014 | Lin | G01R 33/3415 324/318 |

FOREIGN PATENT DOCUMENTS

| | | |
|---|---|---|
| JP | H0318348 A | 1/1991 |
| JP | 2010256318 A | 11/2010 |
| JP | 2013128857 A | 7/2013 |

OTHER PUBLICATIONS

Hayes, et al., Noise Correlations in Data Simultaneously Acquired from Multiple Surface Coil Arrays, Magnetic Resonance in Medicine, 1990, 16:181-191.
Inglis, et al., MRI of the Human Brain at 130 Microtesla, PNAS, 2013, 110(48):19194-19201.
Lapierre, et al., Parallel Imaging and Acceleration in the Johnson Noise Dominated Regime, Proc. Intl. Soc. Mag. Reson. Med., 2013, 21:2772.
Lapierre, et al., An Optimized 8-Channel Helmet Array for Head Imaging at 6.5 mT, Proc. Intl. Soc. Mag. Reson. Med., 2014, 22:1325.
Roemer, et al., The NMR Phased Array, Magnetic Resonance in Medicine, 1990, 16:192-225.
Tsai, et al., An Open-Access, Very-Low-Field MRI System for Posture-Dependent 3He Human Lung Imaging, J. Magn. Reson., 2008, 193(2):274-285.
European Patent Office, Extended European Search Report, Application No. 15761770.5, dated Nov. 21, 2017, 13 pages.
International Search Report and Written Opinion for International Application No. PCT/US2015/020509 dated Jun. 15, 2015.
Giovannetti, G. et al., "A Quadrature Lowpass Birdcage Coil for a Vertical Low Field MRI Scanner", Concepts in Magnetic Resonance Part B (Magnetic Resonance Engineering), vol. 22B, No. 1, pp. 1-6, 2004.
Giovannetti, G. et al., "Low Field Elliptical MR Coil Array Designed by FDTD", Concepts in Magnetic Resonance Part B (Magnetic Resonance Engineering), vol. 33B, No. 1, pp. 32-38, 2008.
Zimmerman, C. L., "Low-field Classroom Nuclear Magnetic Resonance", Master's Thesis, MIT, 2010. Retrieved on Sep. 20, 2019 from URL: https://dspace.mit.edu/handle/1721.1/61245.
IP Australia, Examination Report No. 2 for standard patent application 2015229122, dated Sep. 9, 2019.
Japan Patent Office; Office Action for application 2016-556954, dated Apr. 22, 2020. With translation.

* cited by examiner

SYSTEM AND METHOD FOR LOW-FIELD, MULTI-CHANNEL IMAGING

CROSS-REFERENCE TO RELATED APPLICATIONS

The present application represents the U.S. National Stage of International Application No. PCT/US2015/020509, filed Mar. 13, 2015 which is based on, claims priority to, and incorporates herein by reference, U.S. Provisional Patent Application Ser. No. 61/953,384, filed Mar. 14, 2014, and entitled, "SYSTEM AND METHOD FOR LOW-FIELD, MULTI-CHANNEL IMAGING."

STATEMENT REGARDING FEDERALLY SPONSORED RESEARCH

This invention was made with government support under W81XWH-11-2-076 awarded by the Department of Defense. The government has certain rights in the invention.

BACKGROUND OF THE INVENTION

The present disclosure relates to systems and methods for magnetic resonance imaging (MRI). More particularly, the present disclosure relates to coil systems for low-field MRI (lfMRI)

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Transmit/receive coils are also often referred to as Tx/Rx or Tx/Rx coils to generically refer to the various configurations for the transmit and receive magnetic component of an MRI system. These terms are used interchangeably herein.

Presently, MRI systems deployed in clinical environments are high-field systems because high-field systems have historically been the only MRI solution capable of producing clinically useful images. However, high-field MRI systems are large, costly and require specialized facilities. As a result, the size and expense of high-field MRI systems limit their use and render them unavailable in numerous clinical situations that could benefit from MRI. In many clinical settings, for example, including traumatic brain injury situations, time-critical diagnostic imaging is needed to properly triage and begin treatment. However, in many scenarios, access to high-field MRI scanners is limited. Thus, other imaging or monitoring systems are needed, such as when high-field MRI scanners are not suitable, are impractical, or unavailable.

SUMMARY OF THE DISCLOSURE

The present disclosure overcomes the aforementioned drawbacks by providing a system and method for low-field, magnetic resonance (lfMRI) or nuclear magnetic resonance imaging. The present disclosure provides a system and method that serves the needs for many clinical settings and is free from many of the system requirements of high-field scanners, such as are common today. In particular, a coil system for use with a lfMRI system is provided that achieves a desired signal resolution for clinical applications. For example, the coil system may be particularly contoured to achieve a high filling factor relative to particular anatomy. Also, particular elements of the coil system may be designed, such as by having a selected number of turns, to achieve a high bandwidth. Furthermore, the coil system may employ a decoupling strategy or mechanism that improves operation at low fields. Furthermore, the coil can have geometry that is particularly useful with either longitudinal or transverse MRI scanner magnetic field orientation.

In accordance with one aspect of the invention, a coil system is disclosed for performing parallel magnetic resonance imaging (pMRI) process using a low-field magnetic resonance imaging (lfMRI) system. The system includes a substrate configured to follow a contour of a portion of a subject to be imaged by the lfMRI system using a pMRI process. The system also includes a plurality of coils coupled to the substrate, each coil in the plurality of coils having a number of turns and an associated decoupling mechanism selected to operate the plurality of coils to effectuate the pMRI process using the lfMRI system.

In accordance with another aspect of the invention, a magnetic resonance imaging (MRI) system is disclosed that includes a magnet system configured to generate a low-field static magnetic field about at least a region of interest (ROI) of a subject arranged in the MRI system and a plurality of gradient coils configured to establish at least one magnetic gradient field with respect to the low-field static magnetic field. The system also includes a radio frequency (RF) system including a local coil. The local coil includes a substrate configured to follow a contour of a portion of the subject including the ROI and a plurality of coils coupled to the substrate, each coil in the plurality of coils having a number of turns and an associated decoupling mechanism selected to operate the plurality of coils to effectuate a parallel imaging process using the low-field static magnetic field.

The foregoing and other advantages of the invention will appear from the following description.

DETAILED DESCRIPTION

Figure 1:
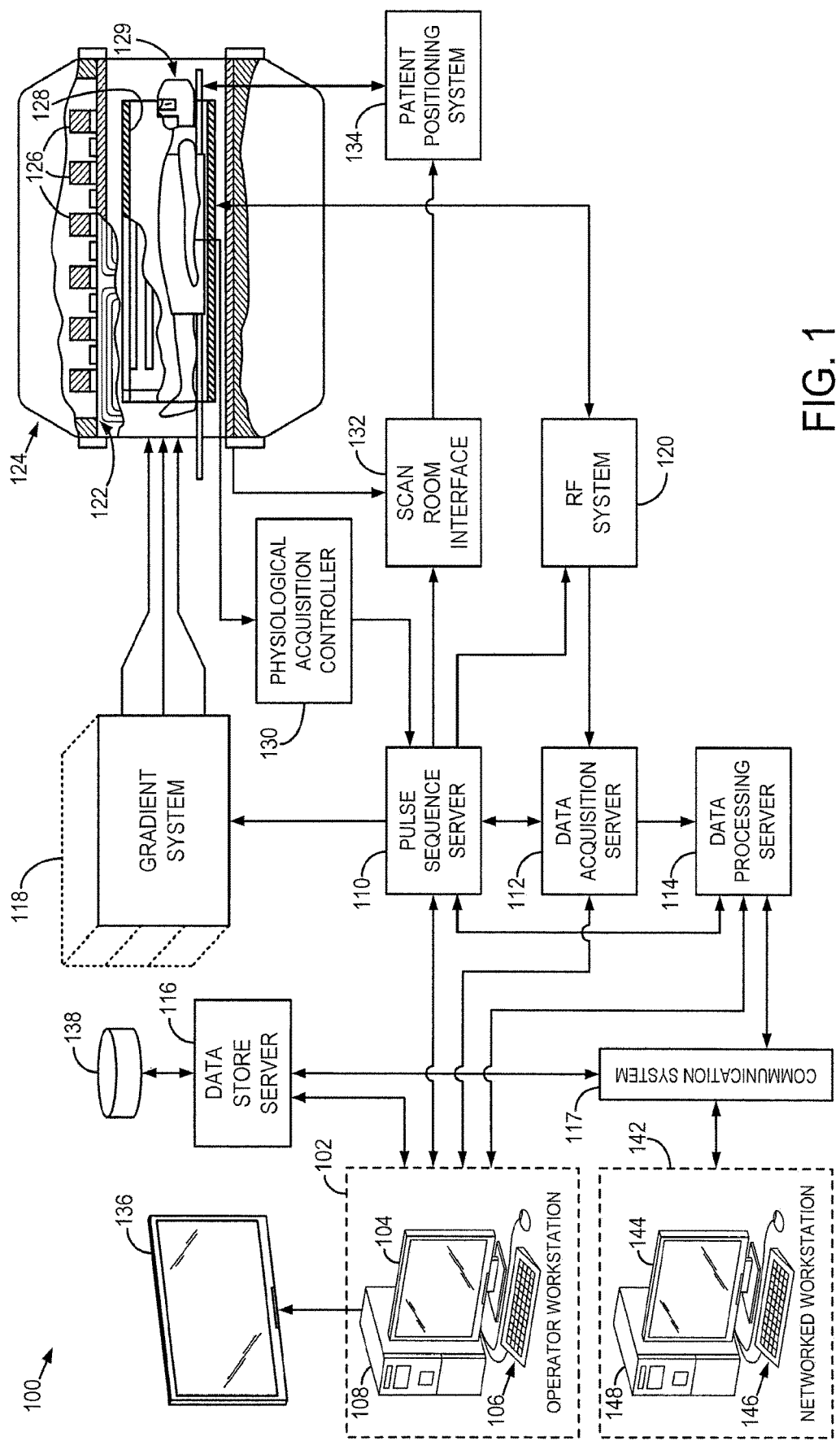
FIG. 1 is a block diagram of an MRI system.

Clinical MRI scanners are predominantly high-field systems, with the majority of installed MRI scanners operating at 1.5 or 3 tesla (T). The trend in MRI is to further increase the field strength to improve image quality and/or reduce scan times. Additionally, to further reduce scan times, high-field MRI systems often employ parallel acquisition techniques utilizing multiple transmit and/or receive coils. Specifically, multiple receive coils or channels operate simultaneously to detect MR signals in parallel, reducing the amount of time it takes to capture data by a factor related to the number of independent receive coils that are operated in parallel. However, while high-field MRI can provide high resolution images at relatively short scan times, the cost of manufacturing, deploying and maintaining a high-field MRI installment is often prohibitive, resulting in significantly limited availability of high-field MRI systems and preventing their use in many clinical situations.

Low-field MRI (e.g., systems that operate at 0.2 T and below) provides a relatively low cost, high availability alternative to high-field MRI. However, low-field MRI presents a number of challenges resulting from the low-field strengths employed, including significantly reduced signal-to-noise ratio (SNR). In particular, the SNR of an MR signal is related to the strength of the main magnetic field B0, which is a significant factor driving high-field MRI and the trend towards higher field strengths. Low-field MRI produces relatively weak MR signals resulting in substantially lower SNR, generally requiring significant averaging over numerous measurements at each "location" of a region of interest (e.g., multiple measurements for each location in k-space) to achieve acceptable SNR. The SNR in high-field MRI is such that only a single measurement is needed at each location due predominantly to the high field strengths involved. While averaging improves SNR, the need to acquire numerous measurements at each location increases scan times. As such, there is a trade-off between SNR and scan time.

The inventors have appreciated that parallel MR techniques can be used to perform averaging of an increased number of measurements without needing to increasing the scan time in the low-field context. According to some embodiments, a plurality of receive coils are provided, wherein parallel measurements obtained via the plurality of receive coils are used to increase the number of measurements that are averaged to perform low-field MRI. Rather than utilizing the increased amount of data acquired simultaneously via parallel receive coils to reduce scan times, as in high-field MRI, the increased data acquisition capability is used to increase the number of measurements that are averaged together to increase the SNR. That is, the time savings resulting from parallel MR is used to average over an increased number of measurements to increase the SNR. According to some embodiments, the acceleration achieved using parallel MR is used in part to increase the number of measurements that are averaged and in part to reduce scan times.

The inventors have further appreciated that the low field strengths employed in low-field MRI facilitate the design of parallel receive coils that are not applicable and/or possible in the high-field context. For example, to transmit excitation pulse sequences and to detect emitted MR signal, transmit/receive coils must resonate at a frequency dependent on the strength of the B0 field. Accordingly, transmit/receive coils in the high-field regime must resonate at significantly higher frequencies than their low-field counterparts. Because of the inverse relationship between the length of a conducting path and the wavelength of the resonant frequency/frequencies in a resonant circuit (i.e., the frequencies at which a coil can produce and detect magnetic fields), the conducting paths of high-field transmit/receive coils are required to be very short. Thus, high-field MRI receive coils are single turn, short path conducting loops.

The inventors have recognized that the low frequencies involved in low-field MRI permit the conducting paths of parallel receive coils to be quite long, allowing for coil designs that are not suitable (or useable) for high-field MRI due to the constraints on conductive path length imposed by the high frequencies involved in high-field MRI. According to some embodiments, a plurality of multi-turn receive coils are provided to produce a multi-channel receive coil array for use in low-field MRI. The plurality of coils may be provided in a three-dimensional geometry about a region of interest. The plurality of coils may be arranged in an overlapping relationship to facilitate decoupling of adjacent receive coils and may be arranged over a surface to detect MR signals emitted from a region of interest, some examples of which are discussed in further detail below.

Additionally, clinical high-field MRI systems typically generate a B0 field via a solenoid coil wound about a cylindrical bore into which the patient being imaged is inserted. As such, the B0 field is oriented along the longitudinal axis of the bore and the body inserted into the bore. To perform MRI, transmit/receive coils must produce a B1 field perpendicular to the B0 field and detect emitted MR signals in this transverse direction. This places further restrictions on the geometry for transmit/receive coils designed for high-field MRI.

Low-field MRI facilitates the design of "open" systems in which the B0 field is generated using, for example, bi-planar coils between which a patient being imaged is placed such that the B0 field is oriented perpendicular to the longitudinal axis of the body. Accordingly, transmit/receive coils are arranged to produce and/or detect magnetic fields transverse to this B0 field, allowing for geometries that are not effective in traditional high-field MRI systems. As a result, bi-planar B0 magnets (or other arrangements that produce a B0 field that is transverse to the axis of the body) allow for the design of parallel receive coils that detect magnetic fields in the axial direction of the body, some examples of which are described in further detail below. Receive coils configured as such are not useable with B0 coils that produce magnetic fields aligned with the axis of the body, such as those commonly used in high-field MRI.

The inventors have further appreciated that the low-field context also facilitates the use of different materials to produce parallel receive coils. For example, conductive paths in receive coils for high-field MRI are typically fabricated from sheets of copper. In the low-field context, conductive paths can be formed using wire, for example, single strand wire, multi-strand wires (e.g., Litz wires), etc. The term "wire" is used herein to describe conductors having a cross-section characteristic of extrusion such that the cross-section has an axis of symmetry (e.g., such as a generally circular cross-section, rectangular cross-section, etc.), as opposed to conductors formed by milling or cutting copper sheets. A wire may be single stranded wire of suitable gauge, or multi-stranded wire such as a Litz wire. According to some embodiments, each receive coil in a parallel receive coil array is formed using wire wound to form a plurality of turns (e.g., 5, 10, 20, 30 or more turns) and arranged about a region of interest.

Furthermore, in parallel MR, separate transmit and receive coils inductively couple, adversely affecting the quality of images that can be acquired. A common decoupling scheme used in high-field MRI involves the use of PIN diodes to effectively detune the receive coils when transmitting and detune the transmit coil while receiving. However, due to unavailability of suitable PIN diodes that operate correctly at frequencies characteristic of low-field MRI, this solution is generally not available in the low-field regime. To decouple transmit and receive coils in the low-field context, the inventors have developed a passive decoupling scheme that does not rely on PIN diodes. According to some embodiments, a crossed-diode configuration is utilized to decouple transmit and receive coils, examples of which are described in further detail below. Such a solution has the benefit of not requiring any active elements.

The inventors have further appreciated that, due to the predominant source of noise in low-field MRI being the noise produced by each of the receive coils in a parallel array (i.e., the so-called Johnson noise), the noise regime makes available certain techniques for reducing noise and increasing SNR. This is in contrast to high-field MRI where the predominant source of noise is produced by the body inserted into the scanner (e.g., via loading effects of the body). As such, SNR can be increased in the low-field context using techniques that would have little or no impact on noise in the high-field noise regime.

According to some embodiments, SNR is improved by reducing resistive losses in the receive coils. For example, receive coils may be formed using multi-strand wires such as a Litz wire. The inventors have appreciated that using a Litz wire may substantially reduce resistive losses, thereby decreasing the noise of the transmit/receive coil and increasing SNR. According to some embodiments, receive coils are cooled to reduce the amount of thermal noise and increase SNR. Techniques for reducing noise in the low-field context can be used alone or in any combination, as the aspects are not limited in this respect.

Following below are more detailed descriptions of various concepts related to, and embodiments of, methods and apparatus for parallel MR, for example, for use in low-field MRI. It should be appreciated that the embodiments described herein may be implemented in any of numerous ways. Examples of specific implementations are provided below for illustrative purposes only. It should be appreciated that the embodiments and the features/capabilities provided may be used individually, all together, or in any combination of two or more, as aspects of the technology described herein are not limited in this respect.

Referring particularly now to FIG. 1, an example of a magnetic resonance imaging (MRI) system 100 is illustrated. The MRI system 100 includes an operator workstation 102, which will typically include a display 104, one or more input devices 106, such as a keyboard and mouse, and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 117, which may include any suitable network connection, whether wired, wireless, or a combination of both. As an example, the communication system 117 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128 and/or local coil, such as a head coil 129.

RF waveforms are applied by the RF system 120 to the RF coil 128, or a separate local coil, such as the head coil 129, in order to perform the prescribed magnetic resonance pulse sequence. Responsive magnetic resonance signals detected by the RF coil 128, or a separate local coil, such as the head coil 129, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays, such as the head coil 129.

The RF system 120 also includes one or more RF receiver channels. Each RF receiver channel includes an RF preamplifier that amplifies the magnetic resonance signal received by the coil 128/129 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (1)$$

and the phase of the received magnetic resonance signal may also be determined according to the following relationship:

$$\varphi = \tan^{-1}\left(\frac{Q}{I}\right). \qquad (2)$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 117. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

Figure 2:
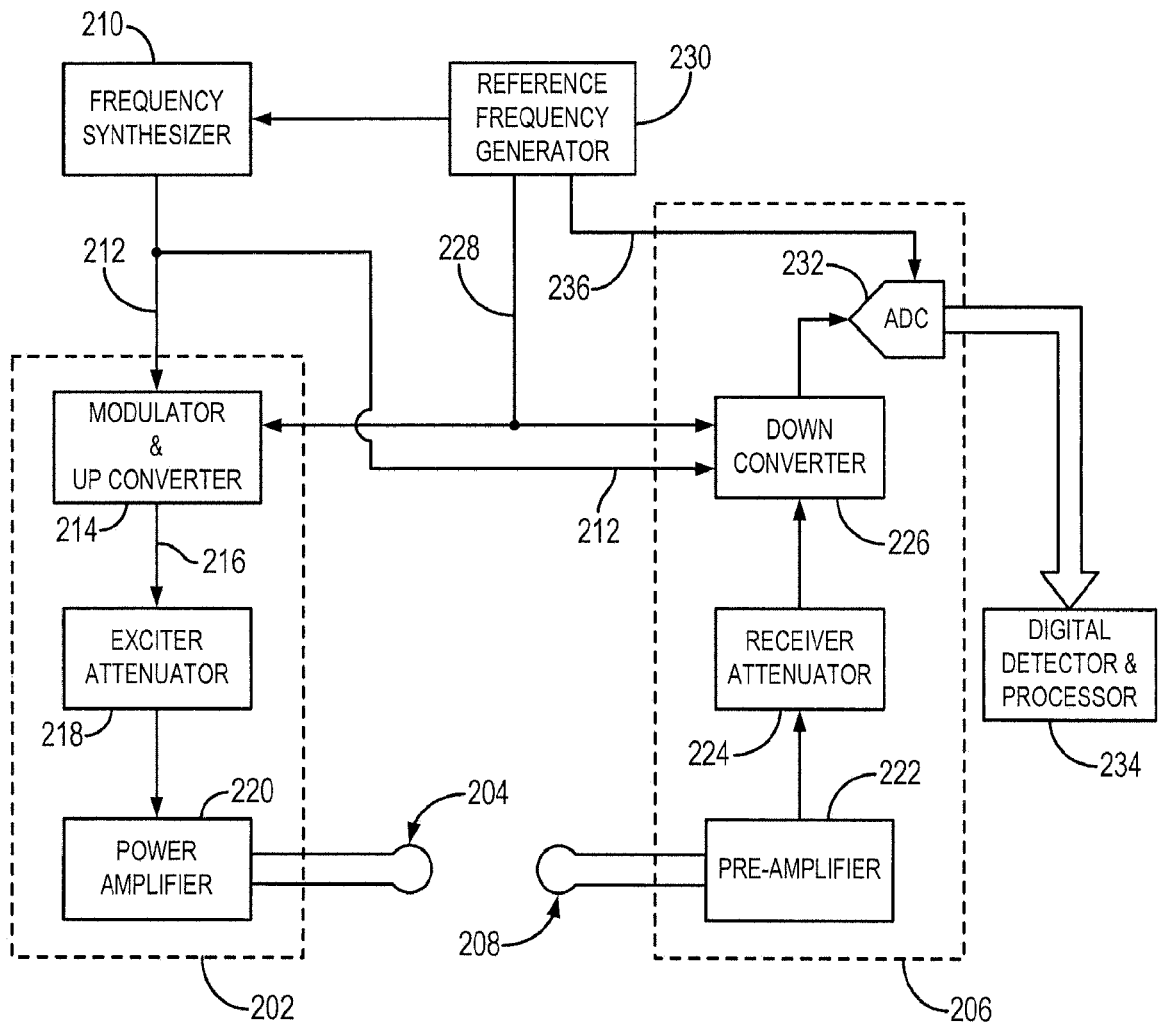
FIG. 2 is a block diagram of an RF system of an MRI system.
Figure 3:
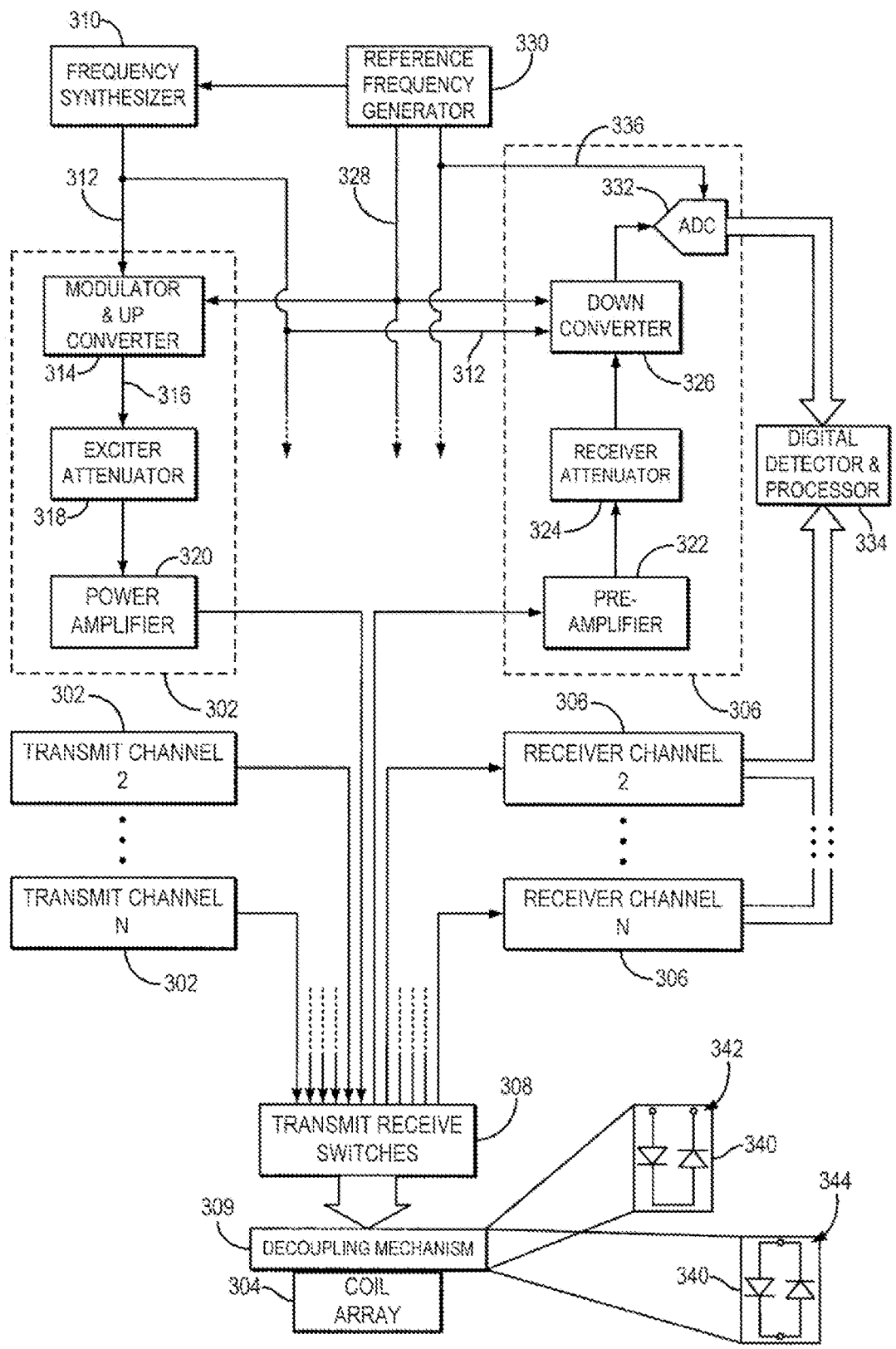
FIG. 3 is a block diagram of an RF system of an MRI system configured for performing parallel MRI (pMRI) processes

With reference to FIGS. 2 and 3, the RF system 120 of FIG. 1 will be further described. In particular, with reference to FIG. 2, the generalities of the RF system 120 will be described and, with reference to FIG. 3, an example of an RF system 120 adapted for parallel imaging applications will be described.

Referring to FIG. 2, the RF system 120 includes a transmission channel 202 that produces a prescribed RF excitation field. The base, or carrier, frequency of this RF excitation field is produced under control of a frequency synthesizer 210 that receives a set of digital signals from the pulse sequence server 110. These digital signals indicate the frequency and phase of the RF carrier signal produced at an output 212. The RF carrier is applied to a modulator and up converter 214 where its amplitude is modulated in response to a signal, R(t), also received from the pulse sequence server 110. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 216 is attenuated by an exciter attenuator circuit 218 that receives a digital command from the pulse sequence server 110. The attenuated RF excitation pulses are then applied to a power amplifier 220 that drives the RF transmission coil 204.

The MR signal produced by the subject is picked up by the RF receiver coil 208 and applied through a preamplifier 222 to the input of a receiver attenuator 224. The receiver attenuator 224 further amplifies the signal by an amount determined by a digital attenuation signal received from the pulse sequence server 110. The received signal is at or around the Larmor frequency, and this high frequency signal is down converted in a two step process by a down converter 226. The down converter 226 first mixes the MR signal with the carrier signal on line 212 and then mixes the resulting difference signal with a reference signal on line 228 that is produced by a reference frequency generator 230. The down converted MR signal is applied to the input of an analog-to-digital ("A/D") converter 232 that samples and digitizes the analog signal. The sampled and digitized signal is then applied to a digital detector and signal processor 234 that produces 16-bit in-phase (I) values and 16-bit quadrature (Q) values corresponding to the received signal. The resulting stream of digitized I and Q values of the received signal are output to the data acquisition server 112. In addition to generating the reference signal on line 228, the reference frequency generator 230 also generates a sampling signal on line 236 that is applied to the A/D converter 232.

Referring to FIG. 3, the RF system 120 may be connected to the whole-body RF coil 128 or, as shown in FIG. 3, a transmission section of the RF system 120 may connect to one or more transmit channels 302 of an RF coil array 304 and a receiver section of the RF system 120 may connect to one or more receiver channels 106 of the RF coil array 304, which may be, for example, a head coil 129, such as illustrated in FIG. 1. The transmit channels 302 and the receiver channels 306 are connected to the RF coil array 304 by way of one or more transmit/receive ("T/R") switches 308. As will be described in further detail, a decoupling mechanism 309 may be provided. In alternative configurations of the RF system 128 in which the receive coils are a separate collection of coils than the transmit coils, T/R switches 308 are not needed and are not used. Instead, in such a configuration the receive array is "detuned" during transmission so that it does not couple to the transmitter. Likewise, during reception, the transmitter is detuned. In this manner, the transmit and receive paths do not mix.

Referring particularly to FIG. 3 and also with reference to FIG. 1, the RF system 120 operates the one or more transmit channels 302 to produce a prescribed RF excitation field. The base, or carrier, frequency of this RF excitation field is produced under control of a frequency synthesizer 310 that receives a set of digital signals from the pulse sequence server 110. These digital signals indicate the frequency and phase of the RF carrier signal produced at an output 312. The RF carrier is applied to a modulator and up converter 314 where its amplitude is modulated in response to a signal, R(t), also received from the pulse sequence server 110. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 316 may be attenuated by an exciter attenuator circuit 318 that receives a digital command from the pulse sequence server 110. The attenuated RF excitation pulses are then applied to a power amplifier 320 that drives the RF coil array 304.

The MR signal produced by the subject is picked up by the RF coil array 302 and applied to the inputs of the set of receiver channels 306. A preamplifier 322 in each receiver channel 306 amplifies the signal, which is then attenuated by a receiver attenuator 324 by an amount determined by a digital attenuation signal received from the pulse sequence server 110. The received signal is at or around the Larmor frequency, and this high frequency signal is down converted in a two step process by a down converter 326. The down converter 326 first mixes the MR signal with the carrier signal on line 312 and then mixes the resulting difference signal with a reference signal on line 328 that is produced by a reference frequency generator 330. The down converted MR signal is applied to the input of an analog-to-digital ("A/D") converter 332 that samples and digitizes the analog signal. As an alternative to down conversion of the high frequency signal, the received analog signal can also be detected directly with an appropriately fast analog-to-digital ("A/D") converter and/or with appropriate undersampling. The sampled and digitized signal is then applied to a digital detector and signal processor 334 that produces 16-bit in-phase (I) values and 16-bit quadrature (Q) values corresponding to the received signal. The resulting stream of digitized I and Q values of the received signal are output to the data acquisition server 112. In addition to generating the reference signal on line 328, the reference frequency generator 330 also generates a sampling signal on line 336 that is applied to the A/D converter 332.

The basic MR systems and principles described above may be used to inform the design of other MR systems that share similar components but operate at very-different parameters. In one example, a low-field magnetic resonance imaging (lfMRI) system utilizes much of the above-described hardware, but has substantially reduced hardware requirements and a smaller hardware footprint. For example, referring to FIG. 4, a system is illustrated that, instead of a 1.5 T or greater static magnetic field, utilizes a substantially smaller magnetic field, for example, a B0 field of 0.2 T or less. According to some embodiments, a 6.5 mT electromagnet-based scanner 400 is provided that is capable of imaging objects up to, for example, 15.6 cm in diameter. However, it should be appreciated that any field strength in the low field regime may be used, as the parallel receive coil techniques described herein are not limited for use with any particular field strength. The system 400 may use a multi-channel array 402 to implement a parallel imaging process, such as a sensitivity encoding (SENSE) imaging procedure.

The system 400 is a relatively transportable and rapidly deployable human imaging system. Current research for low field human imaging is limited and generally uses superconducting quantum interference device (SQUID) sensors. At conventional magnetic field strengths, body noise dominates, resulting in strongly correlated noise on each receive coil in the parallel array. At low field, uncorrelated Johnson noise dominates. The present disclosure recognizes that this phenomenon provides a benefit to parallel imaging and accelerated imaging using, for example, SENSE. However, to perform such parallel imaging techniques, a multi-channel coil is required. Thus, the present disclosure provides a multi-channel coil array 402 that is particularly advantageous, such as for lfMRI.

Figure 4:
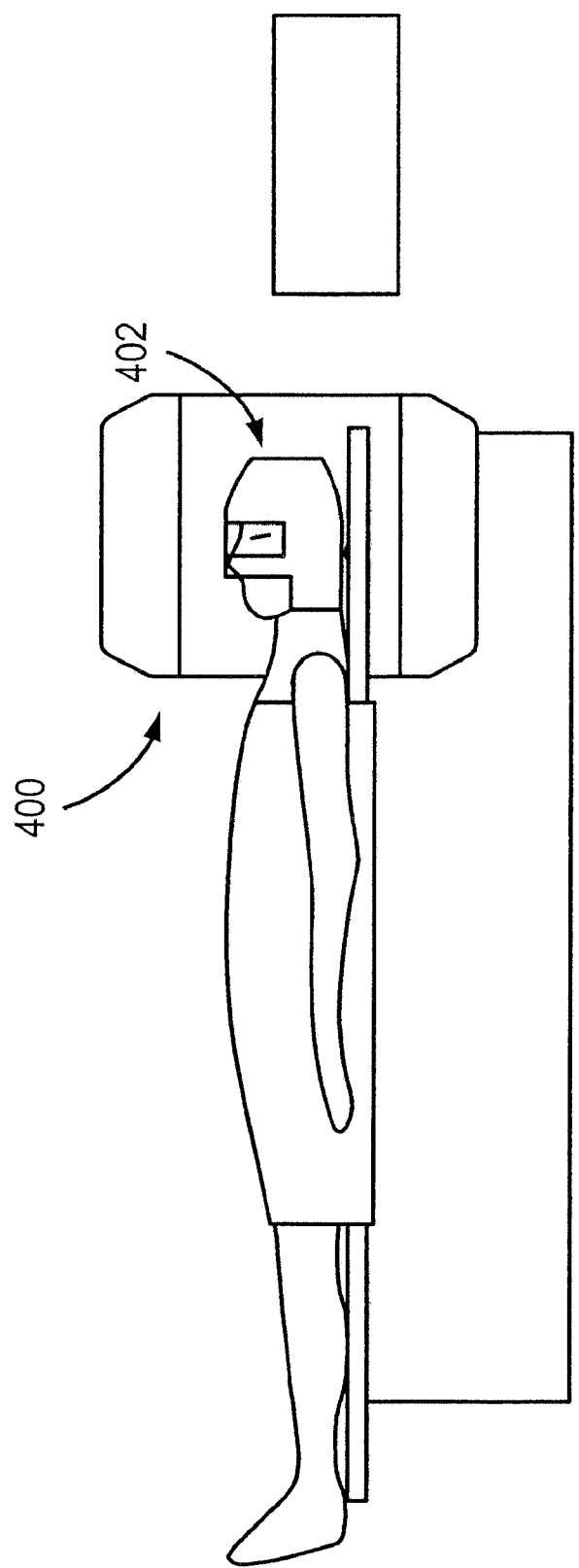
FIG. 4 is a schematic illustration of a low-field MRI (lfMRI) system in accordance with the present disclosure.
Figure 5A:
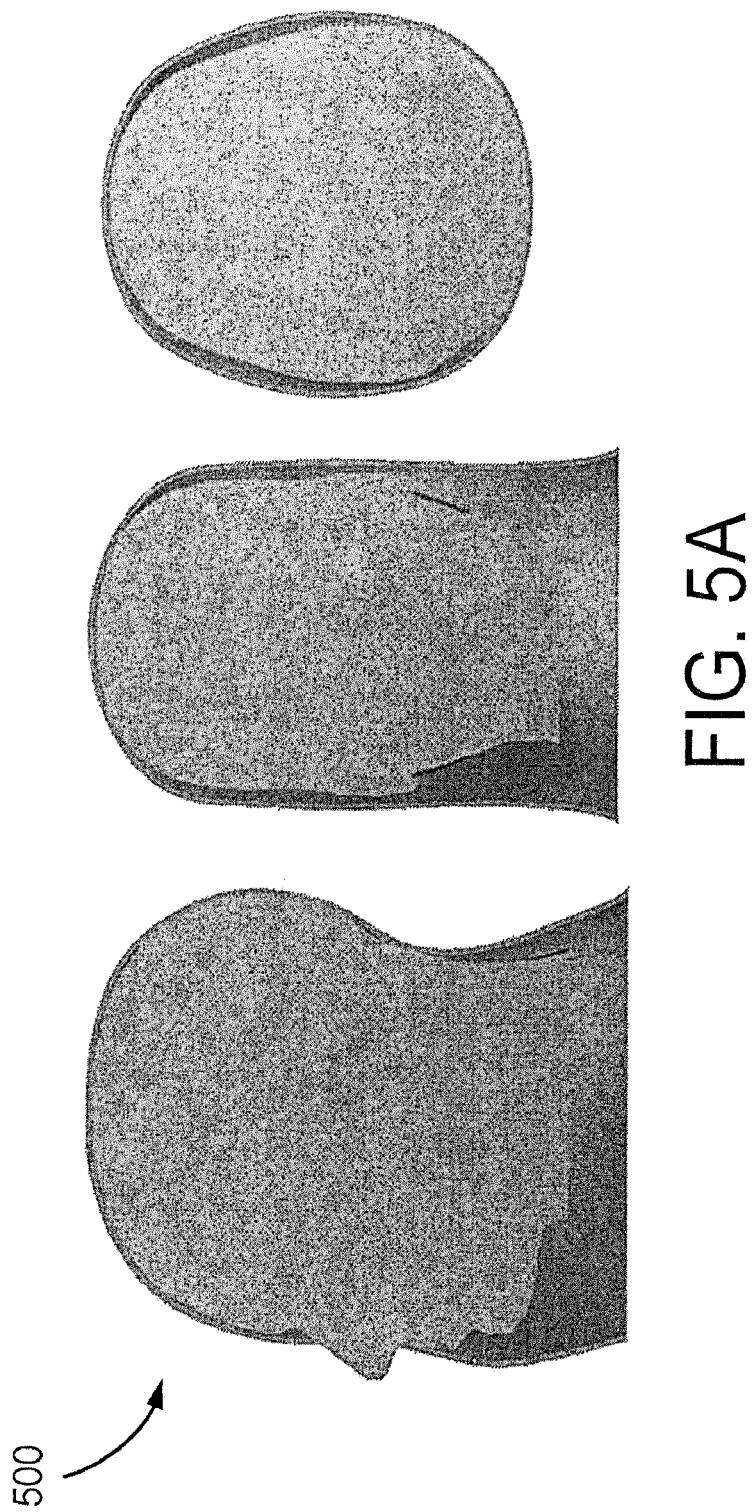
FIG. 5A is a cross-sectional view of a coil system in accordance with the present disclosure and for use with the lfMRI system of FIG. 4.

As illustrated in FIG. 4, the multi-channel array 402 may be designed to perform parallel imaging in vivo, for example, in the human head. As a non-limiting example, the present disclosure will describe an optimized 8-channel array, though any number of channels may be used to provide a multi-channel receive array. Specifically, referring to FIGS. 5A and 5B, the multi-channel array 402 may include a tight fitting substrate or housing 500. In this example, the substrate or housing 500 may be formed as a helmet that tightly follows contours of the associated anatomy. An array of coils 502 may be arranged on or within the housing or substrate 500. In the illustrated example, eight coils 504, 506, 508, 510, 512, 514, 516, 518 are shown. Other numbers of coils may be selected, for example, based on anatomy or to achieve a desired fill factor or acceleration, which can in turn be used to increase SNR, as discussed in further detail below.

As a non-limiting example, the coils 504-518 may be 30-turn, receive-only coils (24 AWG, 4×12 cm and 4×14 cm loops). However, receive coils in a parallel array may be of any size and contain any number of turns provided they satisfy design constraints of the system. It should be appreciated that the exemplary coils illustrated have a conducting length that far exceeds the limit imposed by the high frequencies of the high-field regime. For example, a 14 cm loop having 30 turns will have a conducting path of approximately 320 cm, which is an order of magnitude or more greater than the limit of clinical high-field systems. Thus, the relaxed constraints on conductive length of the receive coils allow for greater flexibility in both the size and shape of the receive coils and the number of turns employed. Each receive coil may be formed, for example, by winding a wire using a respective desired number of turns (which may be different or the same for each coil) to produce a receive coil of the desired shape and size and having desired operating characteristics. The plurality of receive coils can be designed to have different size, shape and turn characteristics so that the coils can be arranged in a three-dimensional geometry to provide adequate coverage for a region of interest.

Furthermore, as a non-limiting example, the coils 504-518 may be tiled about the substrate or housing 500. In the illustrated, non-limiting example, the coils are tilted symmetrical about the sagittal plane. The shapes and sizes of the coils 504-518 may be selected by tiling coils across the substrate or housing 500. In the illustrated example of a helmet, the coils 504-518 may be shaped and sized to tile coils across the substrate or housing 500, while avoiding the flat sides 520 by the ears because these will be perpendicular to B0 field and, therefore, collect minimal signal. Similarly, when extended to other anatomy, placement and selection of the coils 504-518 can follow these principles.

In one non-limiting example, a helmet-shaped coil system was created. The substrate or housing was formed using 3D printing (Fortus 360mc, Stratasys, Eden Prairie, Minn., USA), such that the substrate followed closely to the underlying anatomy. In this non-limiting example, the coil were 4×14 cm and 4×12 cm and all were formed with 24 AWG and 30 turns.

Referring again to FIG. 3, high-performance, low-impedance pre-amps 322 are not readily available for frequency ranges associated with lfMRI (e.g., B0 fields of 0.2 T or less). As such, the transmit and receive coils 304 may include a decoupling mechanism 309 that passively decouples using crossed diodes 340 in series 342 with respect to the transmit channels 302 and in parallel 344 with respect to the receive channels 306. As illustrated, the crossed diodes 340 are formed by two diodes, in parallel or series, but pointing in opposite directions. Passive decoupling diodes 340 may be associated with at each element in the coil array 304. Active detuning solutions based around PIN diodes are not desirable because the carrier lifetime of commercial PIN diodes precludes operation at 276 kHz.

Figure 6:
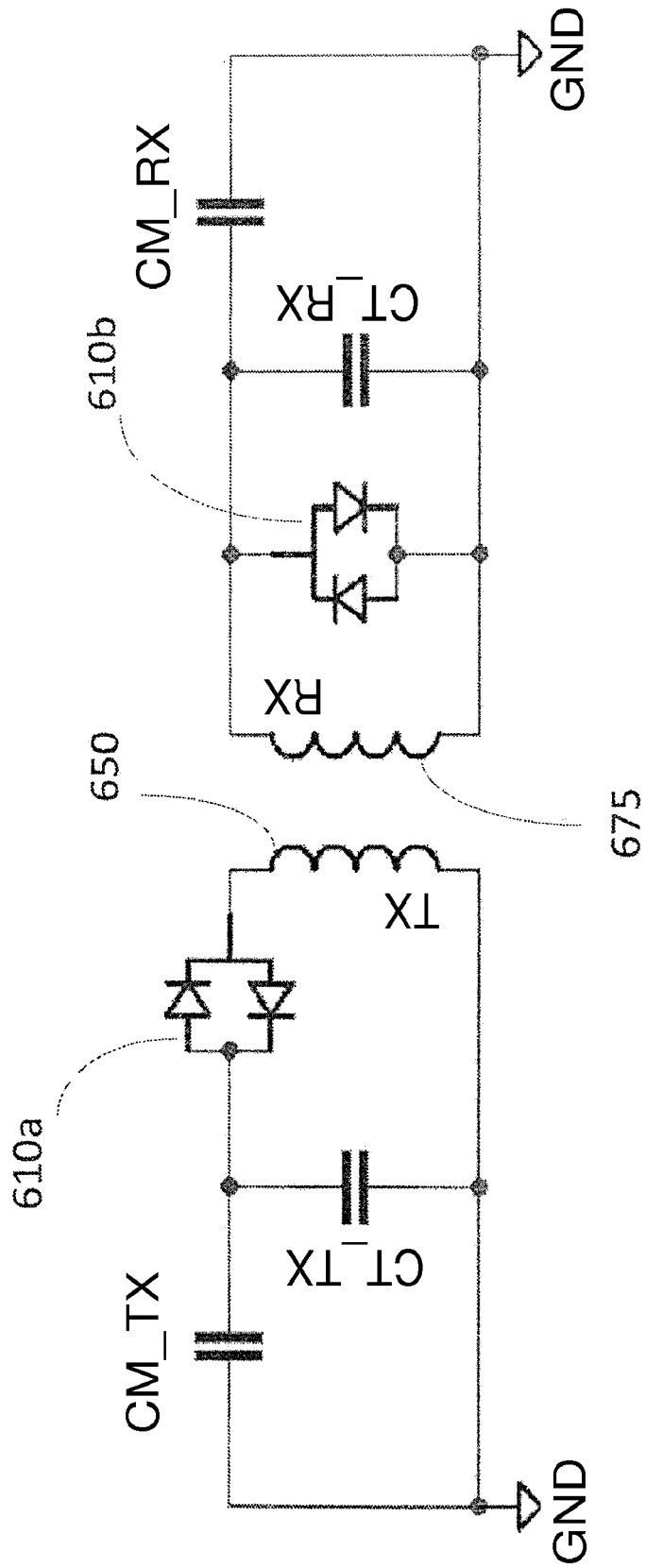
FIG. 6 illustrates a passive decoupling circuit for transmit and receive, in accordance with some embodiments.

FIG. 6 illustrates a circuit diagram of one embodiment of a passive decoupling scheme for a transmit coil and for each of a plurality of parallel receive coils, respectively. For the transmit coil, crossed diodes 610a are connected in series with the transmit coil 650, in conjunction with a parallel tune (CT_TX) and series match (CM-TX) circuit. For each receive coil, crossed diodes 610b are connected in parallel with the respective receive coil 675 along with a parallel tune (CT_RX) and series match (CM-RX) circuit. Crossed-diodes 610a allow the transmit pulse to reach the transmit coil when the pulse voltage is greater than the bias voltage, a condition met during transmit of pulse sequences. During receive, however, the voltage induced in transmit coil 650 from precessing magnetization is too small to forward bias the crossed diodes, resulting in the transmit coil being decoupled during receive. The crossed diodes 610b on the receive circuit short to ground any induced voltage greater than the bias voltage, a condition met during transmit, thereby decoupling the respective receive coil 675 during transmit. As such, the transmit coil is allowed to resonate (e.g., via biased crossed-diodes 610a) when transmit pulses are generated, which transmit pulses cause an induced voltage greater than the bias voltage of crossed diodes 610b, thus decoupling the receive coils. The above described decoupling circuit has no active components and therefore provides a passive decoupling technique.

In one, non-limiting example, all coils were tuned to 276.0 kHz and were matched to at least −27 dB and geometrically decoupled from their nearest neighbors by at least −30 dB. Decoupling from next-nearest neighbors was at least −6 dB. A 30 cm diameter solenoid was used for transmit operations. It should be appreciated that the frequency to which the coils are tuned will depend on the field strength selected for the B0 magnetic field.

Figure 7:
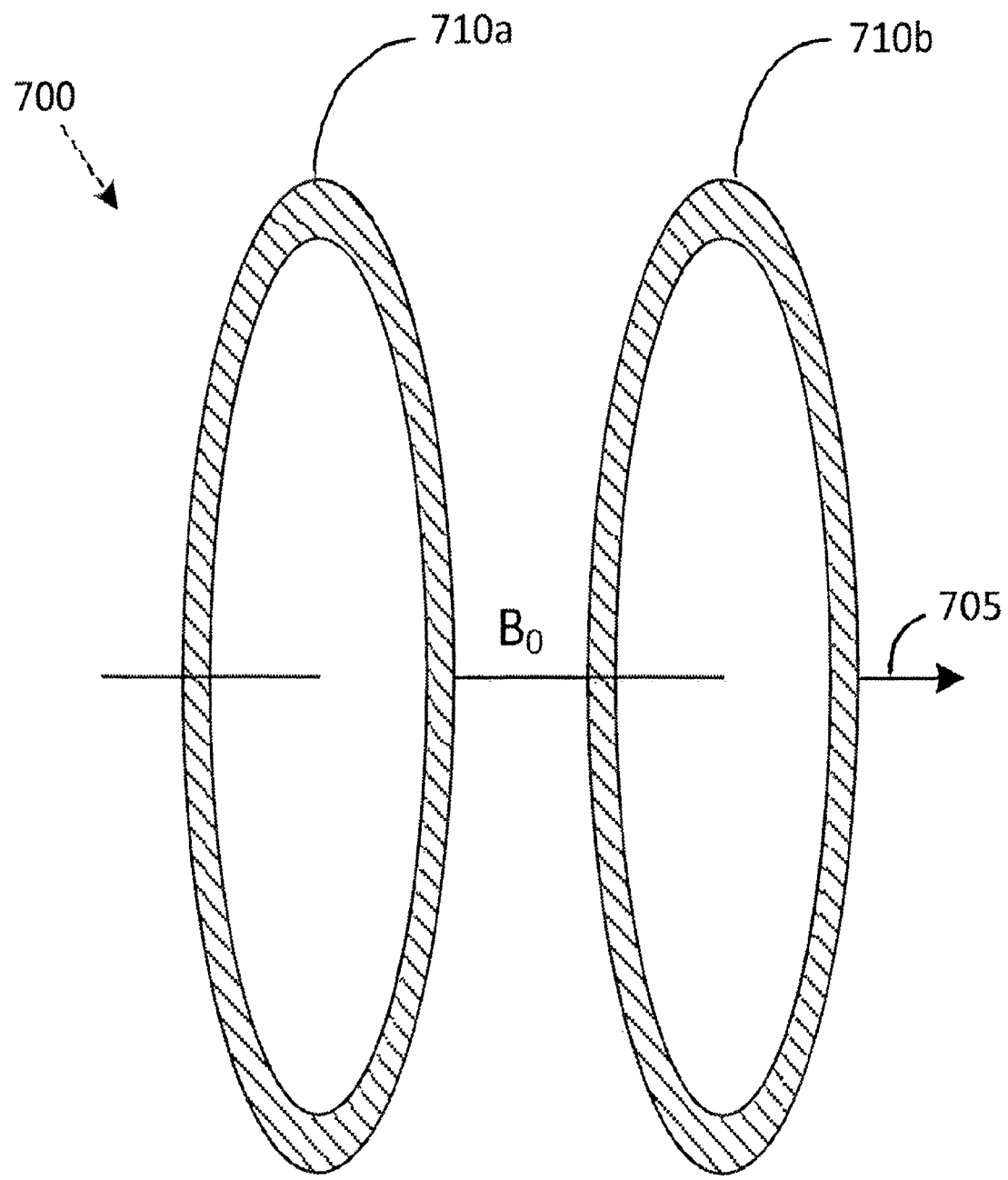
FIG. 7 schematically depicts a bi-planar arrangement for a B0 magnet.
Figure 8:
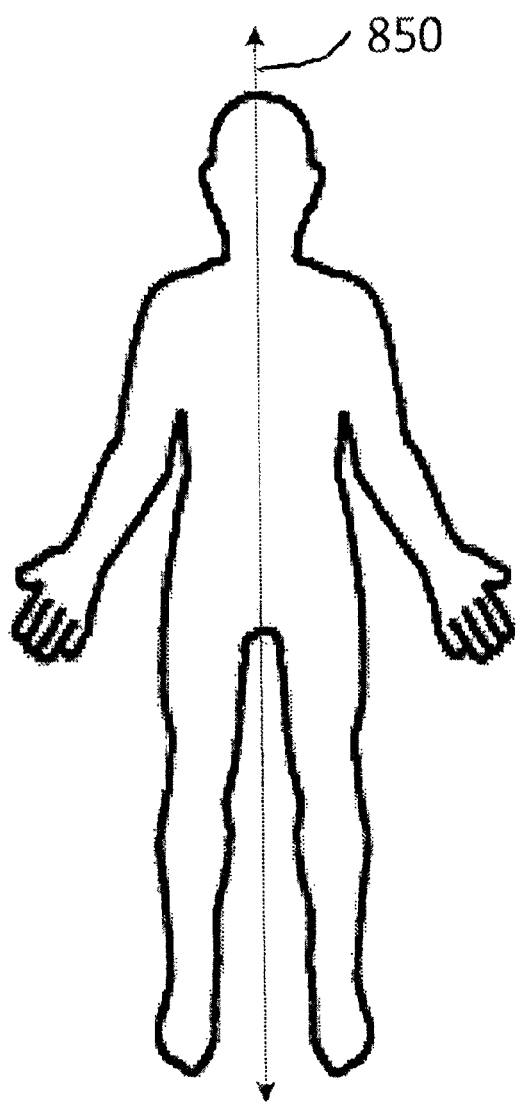
FIG. 8 illustrates an outline of a human body showing the longitudinal axis of the body.

As also discussed above, low-field MRI systems can be constructed using a bi-planar configuration for the B0 magnet. For example, FIG. 7 schematically depicts a magnet 700 to illustrate a bi-planar coil configuration that can be used to generate a B0 field for low-field MRI. As illustrated, the B0 magnet includes coils 710a and 710b that, when operated, produce a B0 field oriented in the direction indicated by arrow 705. When a subject is placed between coils 710a and 710b, B0 is perpendicular to the longitudinal axis of the body of the subject. FIG. 8 illustrates the longitudinal axis 700 of the human body, which is perpendicular to the B0 field of magnet 700 both when the subject is placed between the B0 coils in a upright or supine position.

Figure 5B:
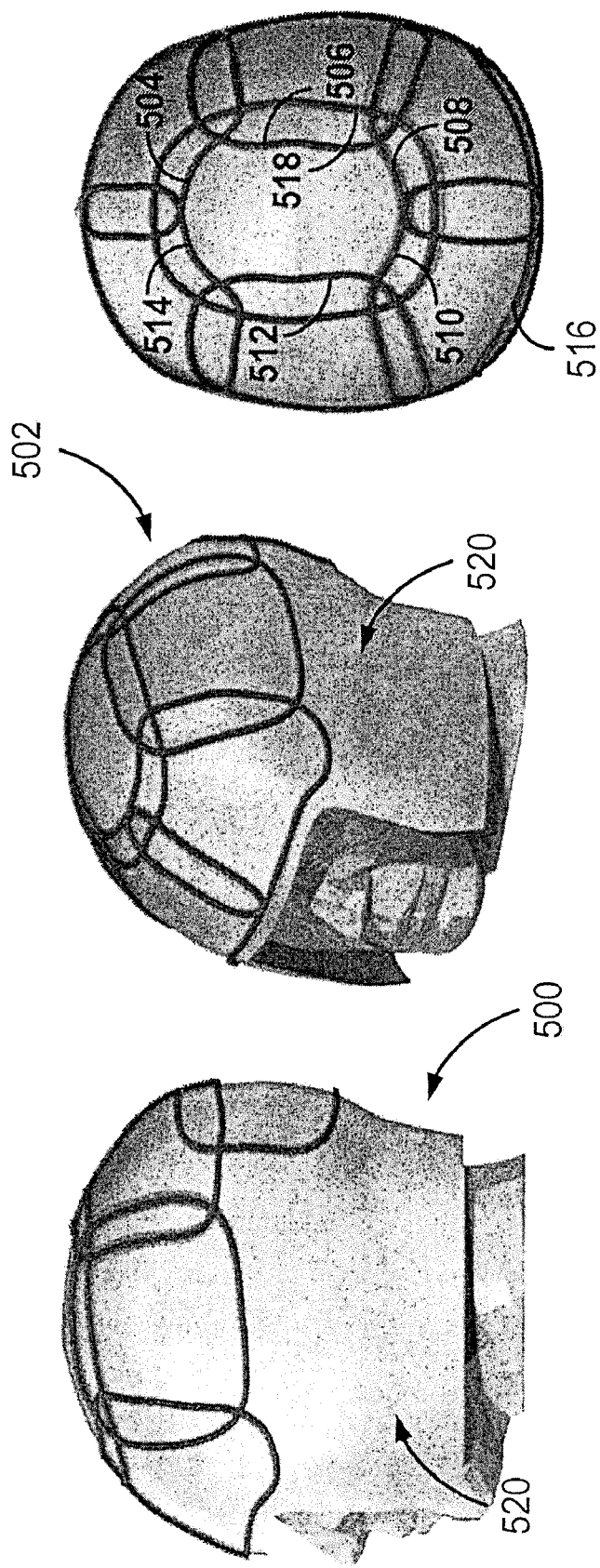
FIG. 5B is a perspective view of a coil system in accordance with the present disclosure and for use with the lfMRI system of FIG. 4.

Accordingly, low-field MRI systems having a B0 field oriented as shown in FIG. 7 (perpendicular to the longitudinal axis of the body) permit the use of the receive coil geometries described herein. By contrast, high-field MRI systems are predominantly produced using a solenoid B0 magnet such that the B0 field is oriented along the longitudinal axis of the body of a subject and the bore into which the subject is inserted, thus requiring a B1 excitation field in a perpendicular direction. The receive coils illustrated in FIG. 5B are arranged to detect magnetic fields substantially aligned with the longitudinal axis of the wearer of the head coil and therefore these coils are ineffective for receive for a solenoid-based B0 magnet.

The inventors have further appreciated that parallel receive coils, examples of which have been described herein, may be used to increase the SNR in MR signal acquisition in the low-field context. As discussed above, the small SNR of low-field MRI is a significant challenge in performing low-field MRI. A technique for addressing the low SNR is to repeat MR data acquisition at a given "location" multiple times (e.g., by repeating a pulse sequence with the same operating parameters) and averaging the obtained MR signal that results. The term "average" is used herein to describe any type of scheme for combining the signals, including absolute average (e.g., mean), weighted average, or any other technique that can be used to increase the SNR by combining MR data from multiple acquisitions. However, while averaging improves SNR, the repeat acquisitions increase total acquisition times. According to some embodiments, the MR data acquired by a plurality of receive coils in parallel is used to increase the number of measurements averaged together for a given location to increase the SNR. As a result, multi-channel receive coils are utilized to increase SNR without necessarily increasing the total acquisition time.

As an example, consider a low-field MRI acquisition using a single-channel receive coil in which N measurements are averaged together to obtain the value at each location (e.g., 25, 50, 100 measurements, etc.) for a total acquisition time T. Using multi-channel receive coils according to the techniques described herein, a factor K acceleration is achieved, for example. Instead of reducing the scan time to T/K, the SNR may be increased by acquiring and averaging KN measurements for each location for the same total acquisition time T. The acceleration can be, in this sense, "traded in" for an equivalent factor more measurements over which to average, thus increasing the SNR.

It should be appreciated that not all of the acceleration need be exchanged to increase the number of measurements that are averaged. For example, some of the factor of K acceleration achieved may be used to reduce the scan time and some may be used to increase SNR. As such, the techniques described herein in this respect can be used to increase SNR and/or reduce scan times, and the acceleration achieved using parallel MR can be allocated as seen fit for a particular imaging application.

Imaging studies were performed using the above-described system. In particular, axial and sagittal images were acquired using a 3D b-SSFP sequence with 50 percent incoherent undersampling of k-space at 6.5 mT (276 kHz). Imaging parameters were: TR/TE=33.2/21.6 ms, acquisition matrix=(64×64×9), voxel size =(3×3×6) mm3, number of averages (NA)=200, and flip angle=70°. The readout duration was 7.04 ms with a 9091 Hz bandwidth. The total acquisition time was 30 min. The resulting images revealed recognizable anatomic features in the head including the skull, cortical structures (gyri/sulci) and the corpus callosum.

Thus systems and methods have been demonstrated for using an optimized multi-channel, local coil, including but not limited to the above-described 8-channel helmet array, combined with fast acquisition techniques and undersampling strategies to enable 3D imaging using IfMRI. With (3.3×4×17) mm3 total voxel size, 2 times greater spatial resolution was acquired than very-recently published work using a SQUID detector in an ultra-low field MRI system with a 80 mT prepolarization field. In addition, the 3D dataset (9 slices) was acquired more than seven times faster than the single-slice 2D brain dataset of the SQUID-detected work.

The present disclosure recognizes that, at low frequency, detector coils for low field NMR and MRI operate in the Johnson noise dominated regime. To this end, the present disclosure recognizes that desirable or optimal coil parameters and decoupling strategies when working within these imaging constraints benefit from a deviation from known engineering art in this regime. As such, the present disclosure provides an array of receive coils suitable for MRI and NMR at low frequency. The coil may be formed to a close-fitting, substrate or housing that is well matched to the human head. Advantageously, the substrate may be 3D printed and contoured to comfortably fit human anatomy and maximize filling factor. Individual receive elements may be tailored so that the number of turns per coil maximizes the induced signal and results in a coil that meets the desired minimum receive coil bandwidth specification. One non-limiting example is coil having a Q of approximately 20. The present disclosure also provides coil decoupling strategies that have been specifically tailored for low frequency operation. This includes passive, crossed diodes at each element to decouple from transmit and nearest neighbor decoupling. Coil tiling geometry can be optimized for either longitudinal or transverse MRI scanner magnetic field. A transmit coil may also be integrated with the above-described coil design.

As such, the present disclosure provides much-needed new resources for a variety of clinical applications, for example, including diagnosis or analysis of critical brain injury triage, monitoring of the progression of ischemic stroke (including measuring brain midline shift), and imaging of patients excluded from conventional MRI due to metal implants, pacemakers, and the like. When combined with hyperpolarized contrast agents, the present disclosure provides systems and methods that can be used for molecular imaging in the brain using low-field scanners.

The present invention has been described in terms of one or more embodiments, and it should be appreciated that many equivalents, alternatives, variations, and modifications, aside from those expressly stated, are possible and within the scope of the invention.

The invention claimed is:

1. A coil system for performing a parallel magnetic resonance imaging (pMRI) process using a low-field magnetic resonance imaging (lfMRI) system, the system comprising:
   a substrate configured to follow a contour of a portion of a subject to be imaged by the lfMRI system using a pMRI process; and
   a plurality of coils coupled to the substrate, each coil in the plurality of coils having a plurality of turns and an associated decoupling mechanism selected to operate the plurality of coils to effectuate the pMRI process using the lfMRI system.

2. The coil system of claim 1 wherein the plurality of turns and the associated decoupling mechanism are selected to operate with a magnetic field strength of 6.5 mT.

3. The coil system of claim 1 wherein the plurality of coils are passively decoupled.

4. The coil system of claim 3 wherein transmit coils are passively decoupled using crossed diodes arranged in series.

5. The coil system of claim 3 wherein receive coils are passively decoupled using crossed diodes arranged in parallel.

6. The coil system of claim 1 wherein the each of the coils in the plurality of coils is tuned to 276.0 kHz.

7. The coil system of claim 1 wherein the each of the coils in the plurality of coils is matched to at least −27 dB.

8. The coil system of claim 1 wherein the each of the coils in the plurality of coils is geometrically decoupled from their nearest neighbors by at least −30 dB.

9. The coil system of claim 8 wherein decoupling from next-nearest neighbors is at least −6 dB.

10. The MRI system of claim 1 wherein the each of the coils in the plurality of coils is matched to at least −27 dB.

11. The MRI system of claim 1 wherein the each of the coils in the plurality of coils is geometrically decoupled from their nearest neighbors by at least −30 dB.

12. The MRI system of claim 11 wherein decoupling from next-nearest neighbors is at least −6 dB.

13. The coil system of claim 1 wherein each coil in the plurality of coils having a plurality of turns is formed using multi-strand wires.

14. The coil system of claim 13 wherein the multi-stand wires form a Litz wire.

15. A magnetic resonance imaging (MRI) system, comprising:
   a magnet system configured to generate a low-field static magnetic field about at least a region of interest (ROI) of a subject arranged in the MRI system;
   a plurality of gradient coils configured to establish at least one magnetic gradient field with respect to the low-field static magnetic field;
   a radio frequency (RF) system including a local coil comprising:
      a substrate configured to follow a contour of a portion of the subject including the ROI; and
      a plurality of coils coupled to the substrate, each coil in the plurality of coils having a plurality of turns and an associated decoupling mechanism selected to operate the plurality of coils to effectuate a parallel imaging process using the low-field static magnetic field.

16. The MRI system of claim 15 wherein magnetic field strength is 6.5 mT.

17. The MRI system of claim 15 wherein the plurality of turns and the associated decoupling mechanism is selected to operate with the low-field static magnetic field.

18. The MRI system of claim 15 wherein the plurality of coils are passively decoupled.

19. The MRI system of claim 18 wherein transmit coils are passively decoupled using crossed diodes arranged in series.

20. The MRI system of claim 18 wherein receive coils are passively decoupled using crossed diodes arranged in parallel.

21. The MRI system of claim 15 wherein the each of the coils in the plurality of coils is tuned to 276.0 kHz.

22. The MRI system of claim 15 wherein the coils in the plurality of coils are arranged in a tiling geometry to be aligned about the ROI and either longitudinally or transversely to low-field static magnetic field.

23. The MRI system of claim 15 wherein each coil in the plurality of coils having a plurality of turns is formed using multi-strand wires.

24. The MRI system of claim 23 wherein the multi-stand wires form a Litz wire.

* * * * *

UNITED STATES PATENT AND TRADEMARK OFFICE
CERTIFICATE OF CORRECTION

| | |
|---|---|
| PATENT NO. | : 10,830,848 B2 |
| APPLICATION NO. | : 15/125514 |
| DATED | : November 10, 2020 |
| INVENTOR(S) | : Matthew S. Rosen et al. |

Page 1 of 1

It is certified that error appears in the above-identified patent and that said Letters Patent is hereby corrected as shown below:

In the Specification

Column 1, Line 19, "W81XWH-11-2-076" should be --W81XWH-11-2-0076--.

Signed and Sealed this
Thirty-first Day of May, 2022

Katherine Kelly Vidal
*Director of the United States Patent and Trademark Office*